United States Patent
Yao et al.

(10) Patent No.: US 9,006,056 B2
(45) Date of Patent: Apr. 14, 2015

(54) METHOD FOR REDUCING INTERFACIAL LAYER THICKNESS FOR HIGH-K AND METAL GATE STACK

(71) Applicant: Taiwan Semiconductor Manufacturing Company, Ltd., Hsinchu (TW)

(72) Inventors: Liang-Gi Yao, Hsinchu (TW); Chun-Hu Cheng, Hsinchu (TW); Chen-Yi Lee, Keelung (TW); Jeff J. Xu, Jhubei (TW); Clement Hsingjen Wann, Carmel, NY (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/904,586

(22) Filed: May 29, 2013

(65) Prior Publication Data
US 2013/0256812 A1    Oct. 3, 2013

Related U.S. Application Data

(63) Continuation of application No. 13/595,599, filed on Aug. 27, 2012, now Pat. No. 8,470,659, which is a continuation of application No. 12/782,859, filed on May 19, 2010, now Pat. No. 8,268,683.

(60) Provisional application No. 61/186,555, filed on Jun. 12, 2009.

(51) Int. Cl.
| H01L 21/8249 | (2006.01) |
| H01L 29/78 | (2006.01) |
| H01L 21/28 | (2006.01) |
| H01L 29/51 | (2006.01) |
| H01L 21/283 | (2006.01) |

(52) U.S. Cl.
CPC .......... *H01L 29/78* (2013.01); *H01L 21/28211* (2013.01); *H01L 29/513* (2013.01); *H01L 21/283* (2013.01)

(58) Field of Classification Search
USPC ................. 438/216, 240, 590–592, 594, 778, 438/785–786, 761, 763; 257/E21.625, 257/E21.266
See application file for complete search history.

(56) References Cited

U.S. PATENT DOCUMENTS

| 7,910,467 B2 | 3/2011 | Hsu et al. |
| 8,268,683 B2 * | 9/2012 | Yao et al. ...................... 438/216 |

(Continued)

FOREIGN PATENT DOCUMENTS

| CN | CB101231950 | 7/2008 |
| CN | 101345260 | 1/2009 |

OTHER PUBLICATIONS

Office Action dated Mar. 12, 2012 from corresponding application No. CN201010212859.0.

*Primary Examiner* — Thanhha Pham
(74) *Attorney, Agent, or Firm* — Lowe Hauptman & Ham, LLP

(57) ABSTRACT

A method of performing an ultraviolet (UV) curing process on an interfacial layer over a semiconductor substrate, the method includes supplying a gas flow rate ranging from 10 standard cubic centimeters per minute (sccm) to 5 standard liters per minute (slm), wherein the gas comprises inert gas. The method further includes heating the interfacial layer at a temperature less than or equal to 700° C. Another method of performing an annealing process on an interfacial layer over a semiconductor substrate, the second method includes supplying a gas flow rate ranging from 10 sccm to 5 slm, wherein the gas comprises inert gas. The method further includes heating the interfacial layer at a temperature less than or equal to 600° C.

20 Claims, 2 Drawing Sheets

(56) References Cited

U.S. PATENT DOCUMENTS

| | | |
|---|---|---|
| 8,470,659 B2 * | 6/2013 | Yao et al. .................. 438/216 |
| 2008/0149980 A1 | 6/2008 | Govindarajan |
| 2009/0014813 A1 | 1/2009 | Chao et al. |
| 2009/0280632 A1 | 11/2009 | Lin et al. |
| 2010/0075507 A1 * | 3/2010 | Chang et al. .............. 438/763 |

* cited by examiner

> 0.8nm
(Thermal oxide or ozonated film)

METHOD FOR REDUCING INTERFACIAL LAYER THICKNESS FOR HIGH-K AND METAL GATE STACK

CROSS-REFERENCE TO RELATED APPLICATIONS

The present application is a continuation of U.S. application Ser. No. 13/595,599, filed Aug. 27, 2012, which is a continuation of U.S. application Ser. No. 12/782,859, filed May 19, 2010, now U.S. Pat. No. 8,268,683, which claims priority of U.S. Provisional Patent Application No. 61/186,555, filed on Jun. 12, 2009, all of which are incorporated herein by reference in their entireties.

TECHNICAL FIELD

This disclosure relates generally to interfacial layer (IL) for gate stack in semiconductor devices, more particularly IL for high dielectric constant (high-k) and metal gate stack.

BACKGROUND

Intentionally grown interfacial layer (IL) is used in order to arrange a good interface between the silicon surface (i.e. the surface of a substrate) and the gate insulator, especially with high-k dielectrics (e.g. $HfO_2$, $HfSiO_4$, $ZrO_2$, $ZrSiO_4$, etc.), and to suppress the mobility degradation of the channel carrier of Metal-Oxide-Semiconductor Field-Effect Transistors (MOSFETs).

Previously, chemical oxide prepared by diluted HF, Standard Clean 1 (SC1), and Standard Clean 2 (SC2), and thin oxide layers by In-Situ Silicon Growth (ISSG), Enhanced In-Situ Silicon Growth (EISSG), Rapid Thermal Oxidation (RTO), etc., were used as IL's in gate stacks, which reaches the limit around 0.8~1.0 nm.

For example, chemical oxide is grown on silicon surface during wet cleaning and rinsing operations, highly hydrated with composition departing from stoichiometric SiO2 ($SiO_x$ with x<2). SC1 is a cleaning solution, Ammonia hydroxide-hydrogen Peroxide-water Mixture (APM, typically 0.25:1:5), used primarily to remove particles from the surface, and also capable of removing surface organics. SC1 forms chemical oxide on Si surface, and is applied at temperature between 40 and 70° C., typically combined with megasonic agitation. SC2 is another cleaning solution, hydrochloric acid-hydrogen peroxide-water mixture (HPM, typically 1:1:5), used primarily to remove metallic contaminants. Also, RTO grows an oxide layer on Si surface during high temperature and short time (typically <60 sec) exposure to oxygen containing ambient.

High-k and metal gate (HK/MG) stacks were used for generations beyond 45 nm technology due to their excellent leakage performance from high-k materials having thicker physical thickness but the same equivalent oxide thickness (EOT). In general, capacitive effective thickness (CET) of 45 nm transistors after thermal budget process is around 1.4 nm, which includes quantum mechanical thickness, EOT of HK, and IL layers. IL thickness is accordingly around 0.8~1.0 nm.

Following the scaling trend, the CET of 32 nm technology and beyond would require EOT of IL layer at least around 0.7 nm (0.6~0.8 nm). The previous methods for IL preparation would not be sufficient to meet this requirement. Besides, the OH termination bonding would be necessary for high-k film deposition, especially for inorganic precursors. This would preclude the potential processes such as HF last pre-clean process, due to its lack of OH bonding for high-k film deposition for inorganic precursors.

Accordingly, new methods are desired to reduce the EOT of IL, thus scale down the CET of a gate stack.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A-FIG. 2D illustrate exemplary steps of the method of forming high-k dielectrics and a metal gate stack with reduced interfacial layer (IL) thickness according to an embodiment.

DETAILED DESCRIPTION OF ILLUSTRATIVE EMBODIMENTS

Figure 1:
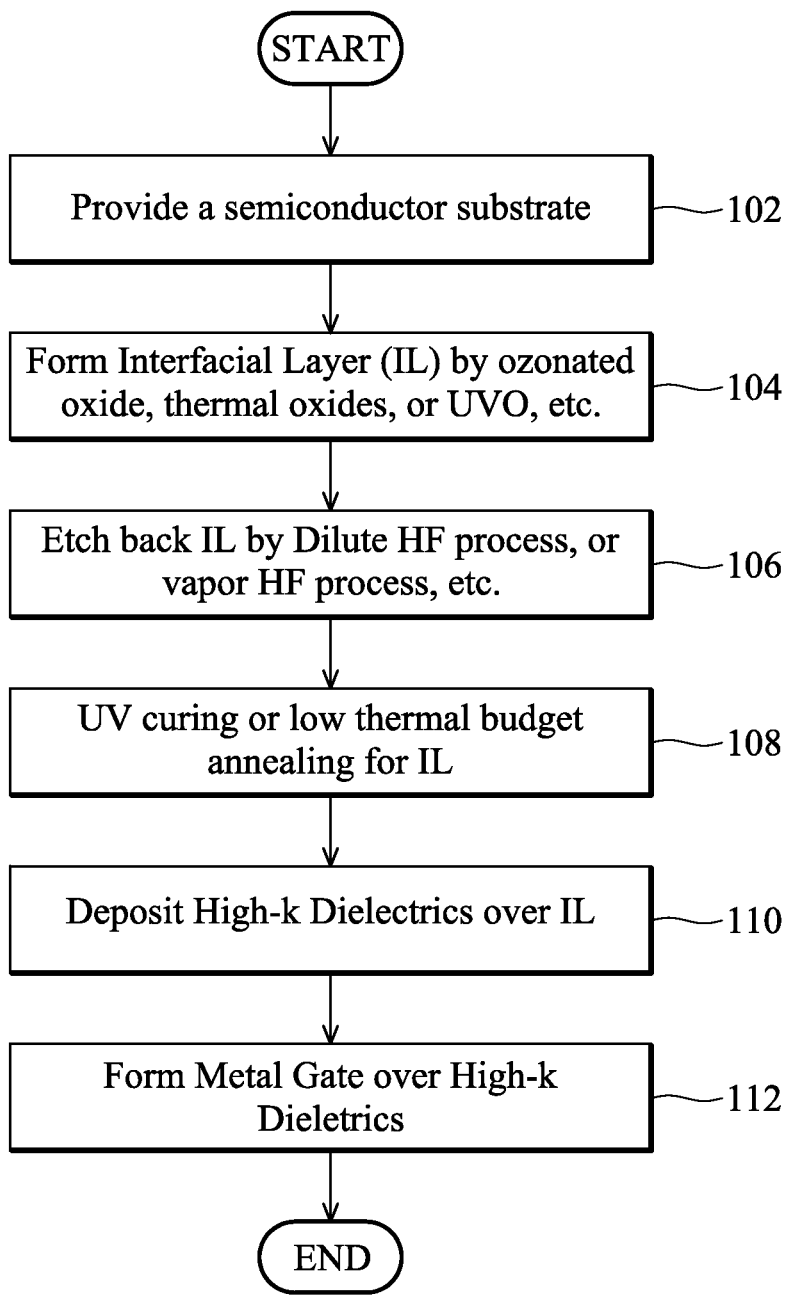
FIG. 1 illustrates an exemplary method of forming high-k dielectrics and a metal gate stack with reduced interfacial layer (IL) thickness according to one embodiment.

The making and using of some embodiments are discussed in detail below. It should be appreciated, however, that the present disclosure provides many applicable embodiments that can be embodied in a wide variety of specific contexts. The specific embodiments discussed are merely illustrative of specific ways to make and use the invention, and do not limit the scope of the invention.

A method of reducing interfacial layer (IL) thickness for high-k dielectrics and metal gate stack is provided. Etching back the IL chemical oxide or other oxide scales the CET of a gate stack down. Throughout the various views and illustrative embodiments of the present invention, like reference numbers are used to designate like elements.

In one embodiment, IL films having high film qualify (e.g., less interface defects) and abundant OH bonding such as ozonated film are etched back to thickness no thicker than 0.7 nm. Then it could be used as IL layer for further high-k film deposition, or cured by UV or other low temperature annealing with ambient control before high-k film deposition. The curing or annealing process would be used to further improve etch-back IL film by densification. By using low temperature annealing process, no OH bonding on IL layer is desorbed and the IL layer is not thickened significantly. Therefore, thinner IL layer, which is no thicker than 0.8 nm, could be used to subsequently deposit a high-k film thereon.

FIG. 1 illustrates an exemplary method for high-k dielectrics and metal gate stack with reduced interfacial layer (IL) thickness according to an embodiment. At step 102, a semiconductor substrate is provided. At step 104, a high quality (e.g., less interface defects) IL film, such as ozonated oxide, thermal oxides, chemical oxide, or ultraviolet ozone (UVO) oxidation from chemical oxide, etc. is formed over the substrate. Ozonated oxide can be grown by high ozone gas, either in gas phase or pre-dissolved in de-ionized (DI) water. The purpose is to grow an IL film with high density. An ultraviolet ozone (UVO) oxidation process can be used to grow ultra thin oxide. UVO from chemical oxide shows a promising scaling capability due to having very thin CET result even with thicker IL. The chemical oxide has very thin CET (~1.37 nm) but larger interface trap density (Dit) and frequency dispersion. Other processes, e.g. EISSG can be also used to form IL. At step 106, IL is etched back by Diluted Hydrofluoric acid (DHF) process, vapor HF process, or SC1 process, or any other suitable process. The CET of gate stack is scaled down by etching back IL.

At step 108, UV curing or low thermal budget annealing can be optionally used to cure or improve etch-back film. The thermal budget defines total amount of thermal energy transferred to the wafer during the given elevated temperature operation, and is proportional to temperature and duration of the process.

In one embodiment, the UV curing can be performed under pressure of less than $10^{-4}$ torr in the ambient and 0.01~10 torr in inert gas ($N_2$, Ar, He, etc.) or dilute $O_2$ in inert gas, with total flow of 10 standard cubic centimeter per minute (sccm) ~5 standard liter per minute (slm) and process time of 5~300 sec, at the process temperature of less than 700° C. (in some embodiments, no greater than 600° C.). In another embodiment, low thermal budget annealing can be performed under atmospheric pressure (AP) or sub-atmospheric pressure (SAP) in the ambient and 100~760 torr in inert gas, with a total flow of 100 sccm~20 slm and process time of 5 sec~60 min, at the process temperature of less than 700° C. (in some embodiments, no greater than 600° C.). Ozonated etch back (OEB) IL can significantly scale down the CET of gate stack (e.g., by about 1-1.5 Å), and UV process could help to reduce CET further (e.g., by about 1.5-2.0 Å).

At step 110, high-k dielectrics can be deposited over etched-back IL. At step 112, metal gate can be formed over the deposited high-k dielectric layer. The IL layers prepared according to the embodiments disclosed in this application could meet the IL scaling trend of HK/MG devices in 32 nm generation or beyond, which can have EOT of IL less than 0.8 nm.

FIG. 2A-FIG. 2D illustrate exemplary steps of the method of forming high-k dielectrics and metal gate stack with reduced interfacial layer (IL) thickness according to an embodiment. In FIG. 2A, an IL 202, e.g. thermal oxide, ozonated film, etc., is formed on a substrate. In one embodiment, the thickness is over 0.8 nm. As mentioned above, a high quality IL film 202, such as ozonated oxide, thermal oxides, chemical oxide, or ultraviolet (UV) curing chemical oxide, etc. can be formed. Ozonated oxide can be grown by high ozone gas, either in gas phase or pre-dissolved in de-ionized (DI) water. An ultraviolet ozone (UVO) oxidation process can be used to grow ultra thin oxide. Other processes, e.g. EISSG, can also be used to form the IL 202.

In FIG. 2B, the IL 202 after etching back is shown, with reduced thickness of less than 0.7 nm. The IL 202 can be etched back by Diluted Hydrofluoric acid (DHF) process, vapor HF process, or SC1 process, or any other suitable process. The CET of gate stack is scaled down by the etched back IL202.

In FIG. 2C, the IL 202 after going through optional UV curing or low thermal budget annealing is shown with a thickness of less than 0.8 nm. The UV curing or low thermal budget annealing can be used to cure or improve etch-back IL film 202. Ozonated etch back (OEB) IL 202 can significantly scale down the CET of gate stack (e.g., by about 1-1.5 Å), and UV process could help to reduce CET further (e.g., by about 1.5-2.0 Å).

In FIG. 2D, high-k (HK) dielectrics 204 are deposited over the IL 202. Further, a metal gate (not shown) can be formed over the high-k dielectric layer 204. A skilled person in the art will appreciate that there can be many embodiment variations of this invention.

The IL layers prepared according to the embodiments disclosed in this application could meet the IL scaling trend of HK/MG devices in 32 nm generation or beyond, which can have EOT of IL less than 0.8 nm, and scale down the CET of gate stack. Further, very good film uniformity could be achieved by OEB IL process.

One aspect of this description relates to a method of performing an ultraviolet (UV) curing process on an interfacial layer over a semiconductor substrate. The method includes supplying a gas flow rate ranging from 10 standard cubic centimeters per minute (sccm) to 5 standard liters per minute (slm), wherein the gas comprises inert gas. The method further includes heating the interfacial layer at a temperature less than or equal to 700° C.

Another aspect of this description relates to a method of performing an annealing process on an interfacial layer over a semiconductor substrate. The method includes supplying a gas flow rate ranging from 10 sccm to 5 slm, wherein the gas comprises inert gas. The method further includes heating the interfacial layer at a temperature less than or equal to 600° C.

Still another aspect of this description relates to a semiconductor structure. The semiconductor structure includes a semiconductor substrate and an interfacial layer over the semiconductor substrate, the interfacial layer having a capacitive effective thickness of less than 1.37 nanometers (nm). The semiconductor structure further includes a high-k dielectric layer over the interfacial layer.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   performing an ultraviolet (UV) curing process on an interfacial layer over a semiconductor substrate, the UV curing process comprising:
      supplying a gas flow rate ranging from 10 standard cubic centimeters per minute (sccm) to 5 standard liters per minute (slm), wherein the gas comprises inert gas;
      heating the interfacial layer at a temperature less than or equal to 700° C.; and
      etching the interfacial layer using diluted hydrofluoric acid prior to flowing the inert gas over the interfacial layer.

2. The method of claim 1, wherein heating the interfacial layer comprises heating the interfacial layer having a capacitive effective thickness of about 1.37 nanometers (nm).

3. The method of claim 1, wherein supplying the gas comprises supplying at least one of nitrogen gas ($N_2$), argon (Ar), or helium (He).

4. The method of claim 1, wherein the UV curing process further comprises supplying the gas flow rate and heating the interfacial layer for a processing time ranging from about 5 seconds to about 300 seconds.

5. The method of claim 1, further comprising reducing the capacitive effective thickness of the interfacial layer by about 1.5 angstroms (Å) to about 2.0 Å.

6. The method of claim 5, further comprising forming a high-k dielectric layer over the interfacial layer.

7. The method of claim 6, further comprising forming a metal gate over the high-k dielectric layer.

8. The method of claim 1, wherein performing the UV curing process comprises performing the UV curing process on the interfacial layer having an equivalent oxide thickness of less than 0.8 nm.

9. A method of forming a semiconductor device, the method comprising:
   performing an annealing process on an interfacial layer over a semiconductor substrate, the annealing process comprising:
      supplying a gas flow rate ranging from 10 sccm to 5 slm, wherein the gas comprises inert gas; and
      heating the interfacial layer at a temperature less than or equal to 600° C., wherein heating the interfacial layer comprises heating the interfacial layer having a capacitive effective thickness of about 1.37 nanometers (nm).

10. The method of claim 9, wherein no OH bonding on the interfacial layer is desorbed during the annealing process.

11. The method of claim 9, wherein supplying the gas comprises supplying at least one of nitrogen gas ($N_2$), argon (Ar), or helium (He).

12. The method of claim 9, wherein the annealing process further comprises supplying the gas flow rate and heating the interfacial layer for a processing time ranging from about 5 seconds to about 60 minutes.

13. The method of claim 9, further comprising reducing the capacitive effective thickness of the interfacial layer by about 1 angstrom (Å) to about 1.5 Å.

14. The method of claim 13, further comprising forming a high-k dielectric layer over the interfacial layer.

15. The method of claim 14, further comprising forming a metal gate over the high-k dielectric layer.

16. The method of claim 9, wherein performing the annealing process comprises performing the annealing process on the interfacial layer having an equivalent oxide thickness of less than 0.8 nm.

17. A method of forming a semiconductor device, the method comprising:
   performing an ultraviolet (UV) curing process on an interfacial layer over a semiconductor substrate, the UV curing process comprising:
      flowing an inert gas over the interfacial layer at a rate ranging from 10 standard cubic centimeters per minute (sccm) to 5 standard liters per minute (slm);
      heating the interfacial layer at a temperature less than or equal to 700° C.; and
      etching the interfacial layer using vaporized hydrofluoric acid prior to flowing the inert gas over the interfacial layer.

18. The method of claim 17, wherein the interfacial layer has an equivalent oxide thickness of less than 0.8 nanometers (nm).

19. The method of claim 17, further comprising:
   forming a high-k dielectric layer over the interfacial layer; and
   forming a metal gate over the high-k dielectric layer.

20. The method of claim 17, further comprising reducing the capacitive effective thickness of the interfacial layer by about 1.5 angstroms (Å) to about 2.0 Å.

* * * * *